US012598823B2

(12) United States Patent
Lu et al.

(10) Patent No.: US 12,598,823 B2
(45) Date of Patent: Apr. 7, 2026

(54) IMAGE SENSOR STRUCTURE

(71) Applicant: Powerchip Semiconductor Manufacturing Corporation, Hsinchu (TW)

(72) Inventors: Ju-Sheng Lu, Hsinchu County (TW); Yi-Ting Wang, Hsinchu County (TW); Ming-Chan Liu, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 731 days.

(21) Appl. No.: 17/992,911

(22) Filed: Nov. 22, 2022

(65) Prior Publication Data

US 2024/0145494 A1     May 2, 2024

(30) Foreign Application Priority Data

Oct. 31, 2022     (TW) ................................. 111141403

(51) Int. Cl.
H10F 39/00          (2025.01)
H10F 39/18          (2025.01)

(52) U.S. Cl.
CPC ......... H10F 39/802 (2025.01); H10F 39/182 (2025.01); H10F 39/8053 (2025.01); H10F 39/8057 (2025.01); H10F 39/811 (2025.01)

(58) Field of Classification Search
CPC .. H10F 39/802; H10F 39/182; H10F 39/8053; H10F 39/8057; H10F 39/811; H10F 39/8063; H10F 39/8067; H10F 39/18
See application file for complete search history.

(56) References Cited

U.S. PATENT DOCUMENTS 8,119,439 B2      2/2012  Park
2020/0106979 A1*  4/2020  Liu ..................... G06V 10/147

FOREIGN PATENT DOCUMENTS

CN         102047427       5/2011
CN         110427854       11/2019
TW         201705457       2/2017
WO         2018155297      8/2018

OTHER PUBLICATIONS

"Office Action of Taiwan Counterpart Application", issued on Jul. 7, 2023, p. 1-p. 9.

* cited by examiner

*Primary Examiner* — Thanh T Nguyen
(74) *Attorney, Agent, or Firm* — JCIPRNET

(57)          ABSTRACT

An image sensor structure including a substrate, a first pixel structure, a second pixel structure, a dielectric layer, and a conductive layer stack is provided. The first pixel structure includes a first light sensing device. The second pixel structure includes a second light sensing device. The conductive layer stack includes conductive layers. The conductive layer stack has a first opening and a second opening. The first opening is located directly above the first light sensing device and passes through the conductive layers. The second opening is located directly above the second light sensing device and passes through the conductive layers. The second minimum width of the second opening is smaller than the first minimum width of the first opening. The luminous flux of the second pixel structure is different from the luminous flux of the first pixel structure.

15 Claims, 12 Drawing Sheets

IMAGE SENSOR STRUCTURE

CROSS-REFERENCE TO RELATED APPLICATION

This application claims the priority benefit of Taiwan application serial no. 111141403, filed on Oct. 31, 2022. The entirety of the above-mentioned patent application is hereby incorporated by reference herein and made a part of this specification.

BACKGROUND

Technical Field

The invention relates to a semiconductor structure, and particularly relates to an image sensor structure.

Description of Related Art

Currently, the image sensor is widely used in many electronic devices (e.g., smart phone or digital camera) and includes pixel structures. In addition, before analyzing the pixel structure to be analyzed, the address of the pixel structure to be analyzed must be located. However, since the current pixel structure localization method cannot accurately locate the pixel structure to be analyzed, the subsequent analysis (e.g., physical failure analysis (PFA)) cannot be performed smoothly.

SUMMARY

The invention provides an image sensor structure, which can accurately locate the pixel structure to be analyzed.

The invention provides an image sensor structure, which includes a substrate, a first pixel structure, a second pixel structure, a dielectric layer, and a conductive layer stack. The first pixel structure includes a first light sensing device. The first light sensing device is disposed in the substrate. The second pixel structure includes a second light sensing device. The second light sensing device is disposed in the substrate. The dielectric layer is disposed on the substrate. The conductive layer stack includes conductive layers. The conductive layer stack has a first opening and a second opening. The conductive layers are disposed in the dielectric layer. The first opening is located directly above the first light sensing device and passes through the conductive layers. The first opening has a first minimum width. The second opening is located directly above the second light sensing device and passes through the conductive layers. The second opening has a second minimum width. The second minimum width of the second opening is smaller than the first minimum width of the first opening. The luminous flux of the second pixel structure is different from the luminous flux of the first pixel structure.

According to an embodiment of the invention, in the image sensor structure, the difference between the luminous flux of the first pixel structure and the luminous flux of the second pixel structure may be 15% to 100% of the luminous flux of the first pixel structure. According to an embodiment of the invention, in the image sensor structure, the difference between the luminous flux of the first pixel structure and the luminous flux of the second pixel structure may be 15% to 50% of the luminous flux of the first pixel structure.

According to an embodiment of the invention, in the image sensor structure, the difference between the luminous flux of the first pixel structure and the luminous flux of the second pixel structure may be 15% to 20% of the luminous flux of the first pixel structure.

According to an embodiment of the invention, in the image sensor structure, the first light sensing device and the second light sensing device may be photodiodes.

According to an embodiment of the invention, the image sensor structure may be a front side illuminated (FSI) image sensor structure.

According to an embodiment of the invention, in the image sensor structure, the portion of the first opening having the first minimum width may be located in any one of the conductive layers, and the portion of the second opening having the second minimum width may be located in any one of the conductive layers.

According to an embodiment of the invention, in the image sensor structure, the dielectric layer may fill the first opening and the second opening. The first pixel structure may further include a first light pipe structure. The first light pipe structure is disposed in the dielectric layer inside the first opening. The second pixel structure may further include a second light pipe structure. The second light pipe structure is disposed in the dielectric layer inside the second opening.

According to an embodiment of the invention, in the image sensor structure, the portion of the first opening having the first minimum width may be located in any one of the conductive layers, and the portion of the second opening having the second minimum width may be located in the conductive layer lower than the bottom of the second light pipe structure.

According to an embodiment of the invention, the image sensor structure may include a pixel array. The pixel array may include the first pixel structures and the second pixel structure.

According to an embodiment of the invention, in the image sensor structure, the second pixel structure may be adjacent to the edge of the pixel array.

According to an embodiment of the invention, in the image sensor structure, the second pixel structure may be adjacent to the corner of the pixel array.

According to an embodiment of the invention, in the image sensor structure, the pixel array may include the second pixel structures. The second pixel structures may be adjacent to each other.

According to an embodiment of the invention, in the image sensor structure, the top-view patterns of the second pixel structures may be arranged in an L-shape or a cross shape.

The invention provides another image sensor structure, which includes a substrate, a first pixel structure, and a second pixel structure. The first pixel structure includes a first light sensing device and a light pipe structure. The first light sensing device is disposed in the substrate. The light pipe structure is disposed directly above the first light sensing device. The second pixel structure includes a second light sensing device. The second light sensing device is disposed in the substrate. There is no light pipe structure directly above the second light sensing device. The luminous flux of the second pixel structure is different from the luminous flux of the first pixel structure.

According to another embodiment of the invention, in the image sensor structure, the material of the light pipe structure may include a color filter material.

According to another embodiment of the invention, in the image sensor structure, the refractive index of the material of the light pipe structure may be greater than the refractive index of the material of the dielectric layer.

According to another embodiment of the invention, in the image sensor structure, the image sensor structure may be a front side illuminated (FSI) image sensor structure.

The invention provides another image sensor structure, which includes a substrate, a first pixel structure, a second pixel structure, a dielectric layer, and a light shielding layer. The substrate includes a first side and a second side opposite to each other. The first pixel structure includes a first light sensing device. The first light sensing device is disposed in the substrate. The first light sensing device is adjacent to the first side of the substrate. The second pixel structure includes a second light sensing device. The second light sensing device is disposed in the substrate. The second pixel structure is adjacent to the first side of the substrate. The dielectric layer is disposed on the second side of the substrate. The light shielding layer is disposed in the dielectric layer. The light shielding layer has a first opening and a second opening. The first opening is located directly above the first light sensing device and passes through the light shielding layer. The first opening has a first minimum width. The second opening is located directly above the second light sensing device and passes through the light shielding layer. The second opening has a second minimum width. The second minimum width of the second opening is smaller than the first minimum width of the first opening. The luminous flux of the second pixel structure is different from the luminous flux of the first pixel structure.

According to another embodiment of the invention, the image sensor structure may be a backside illuminated (BSI) image sensor structure.

Based on the above description, in the image sensor structure according to the invention, the luminous flux of the second pixel structure is different from the luminous flux of the first pixel structure. Therefore, the address of the first pixel structure to be analyzed can be located by using the second pixel structure as a reference point. In this way, the first pixel structure to be analyzed can be accurately located, which facilitates the subsequent analysis (e.g., physical failure analysis (PFA)) and improves the analysis process, thereby reducing the manufacturing cost and the process time.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
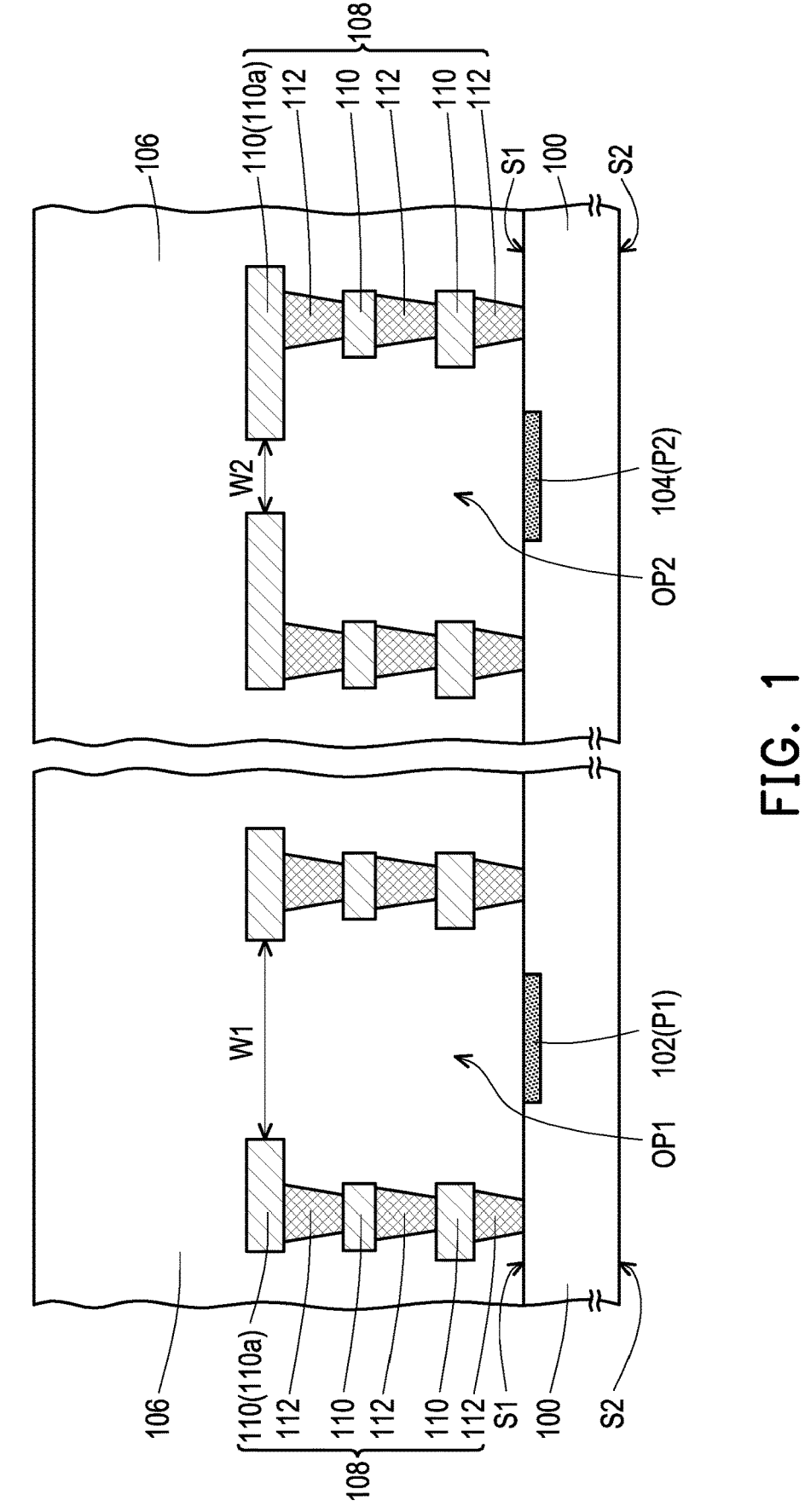
FIG. 1 is a cross-sectional view illustrating an image sensor structure according to some embodiments of the invention.
Figure 2:
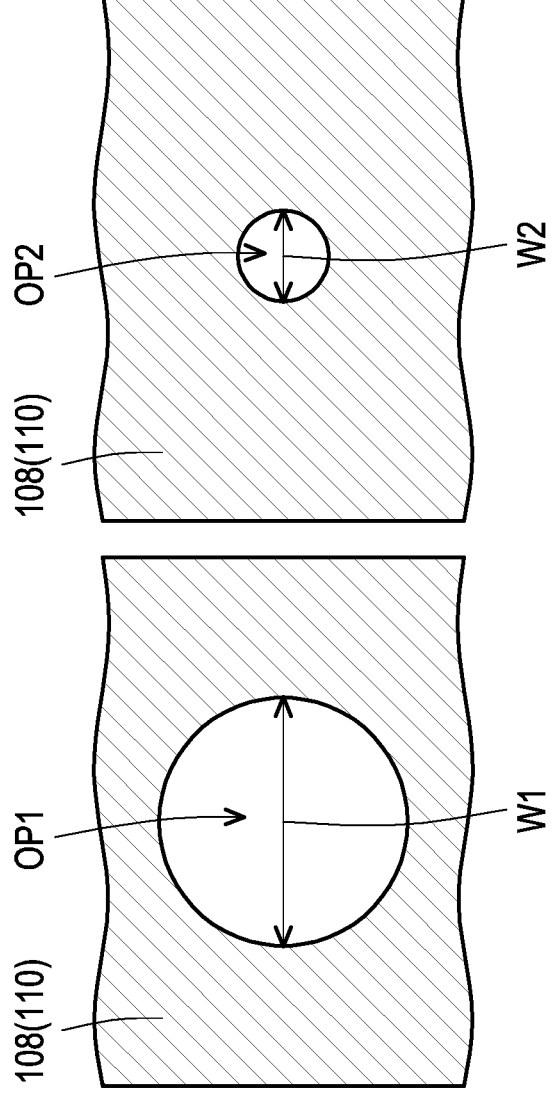
FIG. 2 is a top view of a conductive layer stack in FIG. 1.
Figure 3:
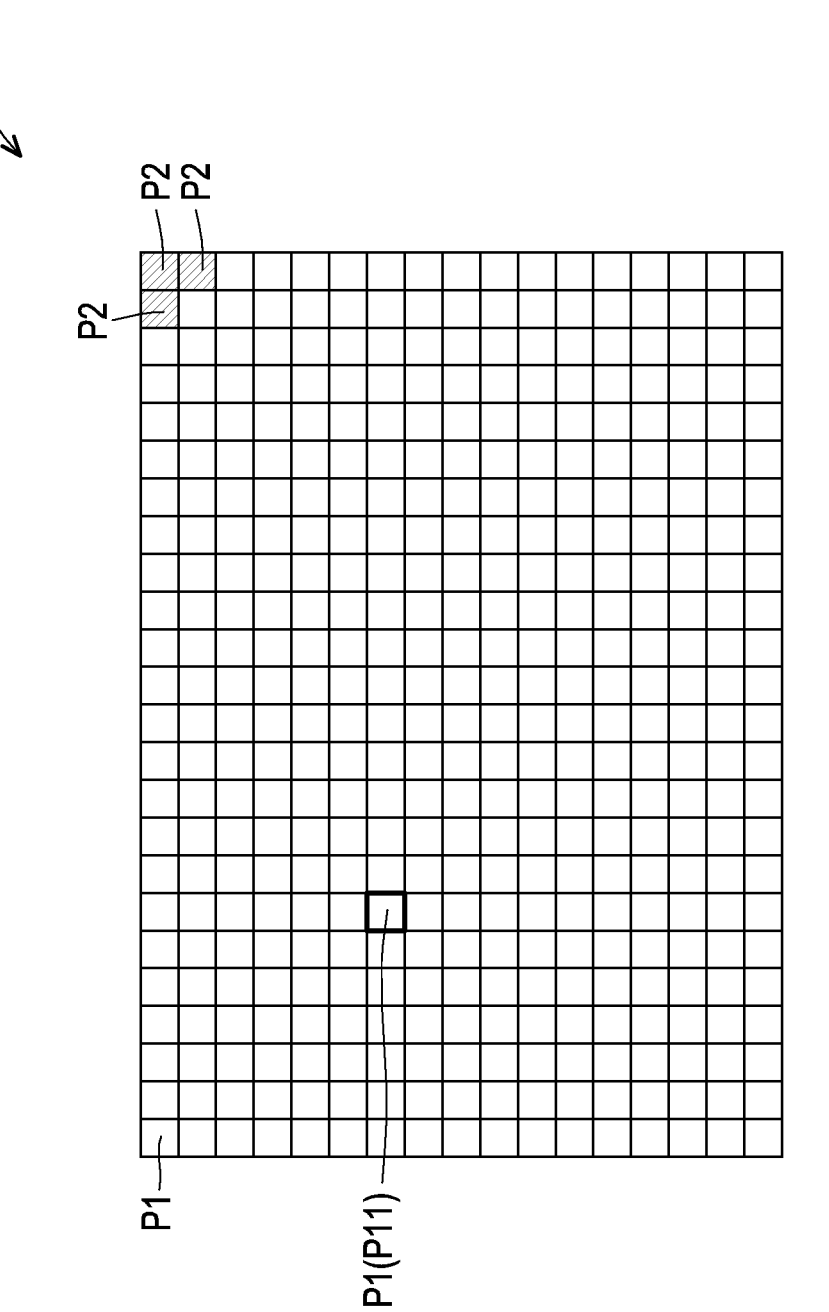
FIG. 3 is a top view illustrating a pixel array according to some embodiments of the invention.
Figure 4:
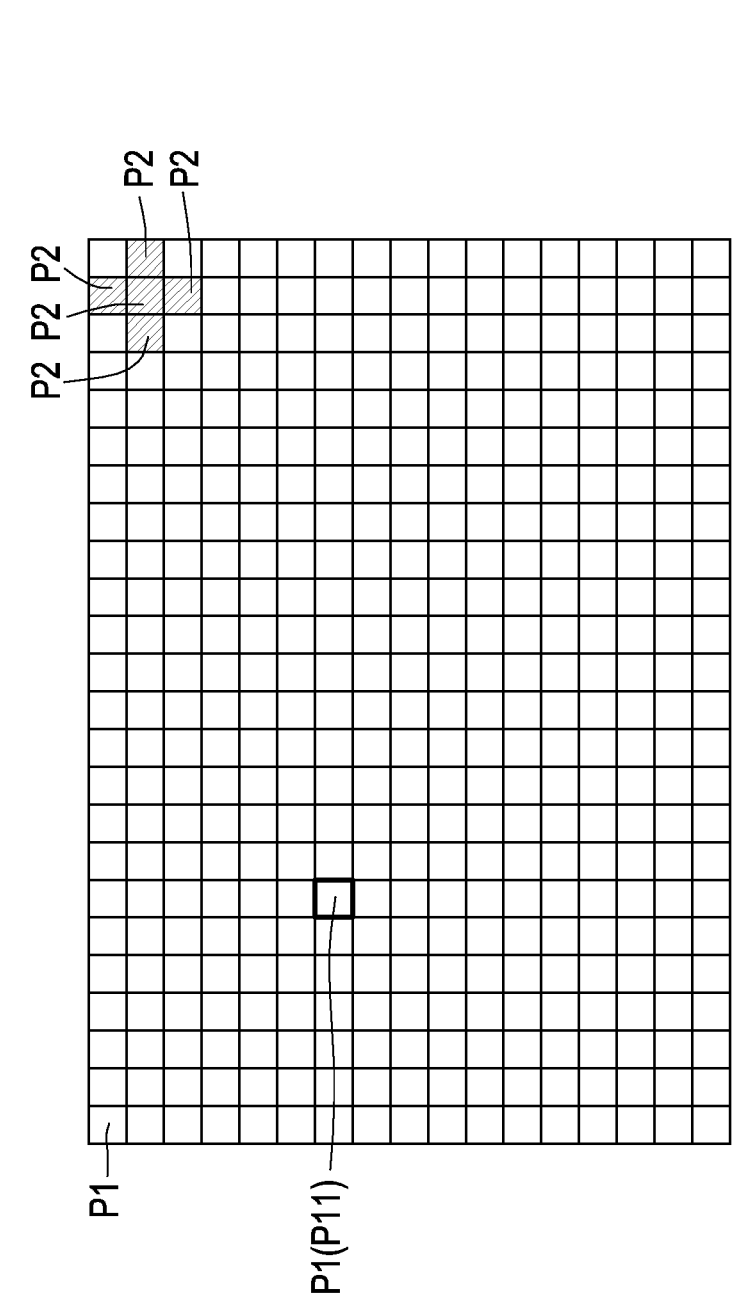
FIG. 4 is a top view illustrating a pixel array according to other embodiments of the invention.

FIG. 1 is a cross-sectional view illustrating an image sensor structure according to some embodiments of the invention. FIG. 2 is a top view of a conductive layer stack in FIG. 1. FIG. 3 is a top view illustrating a pixel array according to some embodiments of the invention. FIG. 4 is a top view illustrating a pixel array according to other embodiments of the invention.

Referring to FIG. 1, an image sensor structure 10 includes a substrate 100, a pixel structure P1, and a pixel structure P2. In the present embodiment, the image sensor structure 10 may be a front side illuminated (FSI) image sensor structure. The substrate 100 may have a first side 51 and a second side S2 opposite to each other. In some embodiments, the first side 51 may be the front side of the substrate 100, and the second side S2 may be the back side of the substrate 100. In some embodiments, the substrate 100 may be a semiconductor substrate such as a silicon substrate. In addition, although not shown in FIG. 1, the substrate 100 may have required components therein and/or thereon, such as transistor devices, and the description thereof is omitted here.

The pixel structure P1 includes a light sensing device 102. The light sensing device 102 is disposed in the substrate 100. The light sensing device 102 may be adjacent to the first side 51 of the substrate 100. In some embodiments, the light sensing device 102 may be a photodiode.

The pixel structure P2 includes a light sensing device 104. The light sensing device 104 is disposed in the substrate 100. The light sensing device 104 may be adjacent to the first side 51 of the substrate 100. In some embodiments, the light sensing device 104 may be a photodiode.

The image sensor structure 10 may further include a dielectric layer 106 and a conductive layer stack 108. The dielectric layer 106 is disposed on the substrate 100. For example, the dielectric layer 106 may be disposed on the first side S1 of the substrate 100. In some embodiments, the dielectric layer 106 may be a multilayer structure. In some embodiments, the material of the dielectric layer 106 is, for example, silicon oxide, silicon nitride, silicon oxynitride, or a combination thereof.

In some embodiments, the conductive layer stack 108 may include an interconnect structure, a light shielding layer, or a combination thereof. The conductive layer stack 108 may include conductive layers 110. The conductive layers 110 are disposed in the dielectric layer 106. In some embodiments, all the conductive layers 110 may be electrically connected to each other, but the invention is not limited thereto. In other embodiments, a portion of the conductive layers 110 may not be electrically connected to each other. Each of the conductive layers 110 may be a single-layer structure or a multilayer structure. In some embodiments, the conductive layer 110 may be a metal layer. In some embodiments, the material of the conductive layer 110 is, for example, copper, aluminum, tungsten, tantalum, tantalum nitride, titanium, titanium nitride, or a combination thereof. In addition, the number of the conductive layers 110 is not limited to the number shown in FIG. 1. One of ordinary skill in the art may adjust the number of the conductive layers 110 according to the product requirement.

The conductive layer stack 108 may further include plugs 112. The plugs 112 are disposed in the dielectric layer 106. The plug 112 may be electrically connected to the conductive layer 110. The conductive layers 110 may be electrically connected to each other by the plug 112. In some embodiments, the plug 112 may be a via plug or a contact plug. Each of the plugs 112 may be a single-layer structure or a multilayer structure. In some embodiments, the material of the plugs 112 is, for example, tungsten, copper, aluminum, tantalum, tantalum nitride, titanium, titanium nitride, or a combination thereof. In addition, the number of the plugs 112 is not limited to the number shown in FIG. 1. One of ordinary skill in the art may adjust the number of the plugs 112 according to the product requirement.

Referring to FIG. 1 and FIG. 2, the conductive layer stack 108 may have an opening OP1 and an opening OP2. The opening OP1 may be located directly above the light sensing device 102 and may pass through the conductive layers 110. The opening OP1 may have a minimum width W1. The opening OP2 may be located directly above the light sensing device 104 and may pass through the conductive layers 110. The opening OP2 may have a minimum width W2. The dielectric layer 106 may fill the opening OP1 and the opening OP2.

The minimum width W2 of the opening OP2 may be smaller than the minimum width W1 of the opening OP1, so that the luminous flux of the pixel structure P2 may be smaller than the luminous flux of the pixel structure P1. In this way, the luminous flux of the pixel structure P2 is different from the luminous flux of the pixel structure P1. In the text, the luminous flux may be defined as the luminous energy sensed by the light sensing device (e.g., light sensing device 102 and light sensing device 104).

In some embodiments, the difference between the luminous flux of the pixel structure P1 and the luminous flux of the pixel structure P2 may be 15% to 100% of the luminous flux of the pixel structure P1. In some embodiments, the difference between the luminous flux of the pixel structure P1 and the luminous flux of the pixel structure P2 may be 15% to 50% of the luminous flux of the pixel structure P1. In some embodiments, the difference between the luminous flux of the pixel structure P1 and the luminous flux of the pixel structure P2 may be 15% to 20% of the luminous flux of the pixel structure P1. In addition, the range of the above-mentioned difference helps to distinguish the pixel structure P1 from the pixel structure P2.

The portion of the opening OP1 having the minimum width W1 may be located in any one of the conductive layers 110, and the portion of the opening OP2 having the minimum width W2 may be located in any one of the conductive layers 110. In the present embodiment, the portion of the opening OP1 having the minimum width W1 may be located in the topmost conductive layer (e.g., conductive layer 110a) of the conductive layers 110, and the portion of the opening OP2 having the minimum width W2 may be located in the topmost conductive layer (e.g., conductive layer 110a) of the conductive layers 110, but the invention is not limited thereto. As long as the minimum width W2 of the opening OP2 may be smaller than the minimum width W1 of the opening OP1, it falls within the scope of the invention.

In some embodiments, the image sensor structure 10 may further include components such as the color filter and the microlens (not shown) sequentially disposed on the dielectric layer 106 and the conductive layer stack 108, and the description thereof is omitted here.

Referring to FIG. 3, the image sensor structure 10 may include a pixel array PA1. The pixel array PA1 may include the pixel structures P1 and the pixel structure P2. In the present embodiment, the pixel array PA1 may include the pixel structures P2, but the invention is not limited thereto. As long as the pixel array PA1 includes at least one pixel structure P2, it falls within the scope of the invention. The pixel structures P2 may be adjacent to each other. In some embodiments, the pixel structure P2 may be adjacent to the edge of the pixel array PA1, thereby preventing the yield and the image presentation from being affected. For example, the pixel structure P2 may be adjacent to the corner of the pixel array PA1.

In some embodiments, the top-view patterns of the pixel structures P2 may be arranged in a special shape to facilitate the identification of the positions of the pixel structures P2. In the present embodiment, the top-view patterns of the pixel structures P2 may be arranged in an L-shape, but the invention is not limited thereto. One of ordinary skill in the art may adjust the shape in which the top-view patterns of the pixel structures P2 are arranged according to the product requirement. In other embodiments, as shown in FIG. 4, the top-view patterns of the pixel structures P2 may be arranged in a cross shape.

In some embodiments, the pixel localization method of the image sensor structure 10 may include the following steps. First, the image sensor structure 10 is provided. Next, the pixel structure P1 (e.g., pixel structure P11) to be analyzed is selected from the pixel structures P1. Then, the address of the pixel structure P1 (e.g., pixel structure P11) to be analyzed is located by using the pixel structure P2 as a reference point.

Based on the above embodiments, in the image sensor structure 10, the luminous flux of the pixel structure P2 is different from the luminous flux of the pixel structure P1. Therefore, the address of the pixel structure P1 to be analyzed can be located by using the pixel structure P2 as a reference point. In this way, the pixel structure P1 to be analyzed can be accurately located, which facilitates the subsequent analysis (e.g., physical failure analysis (PFA)) and improves the analysis process, thereby reducing the manufacturing cost and the process time.

Figure 5:
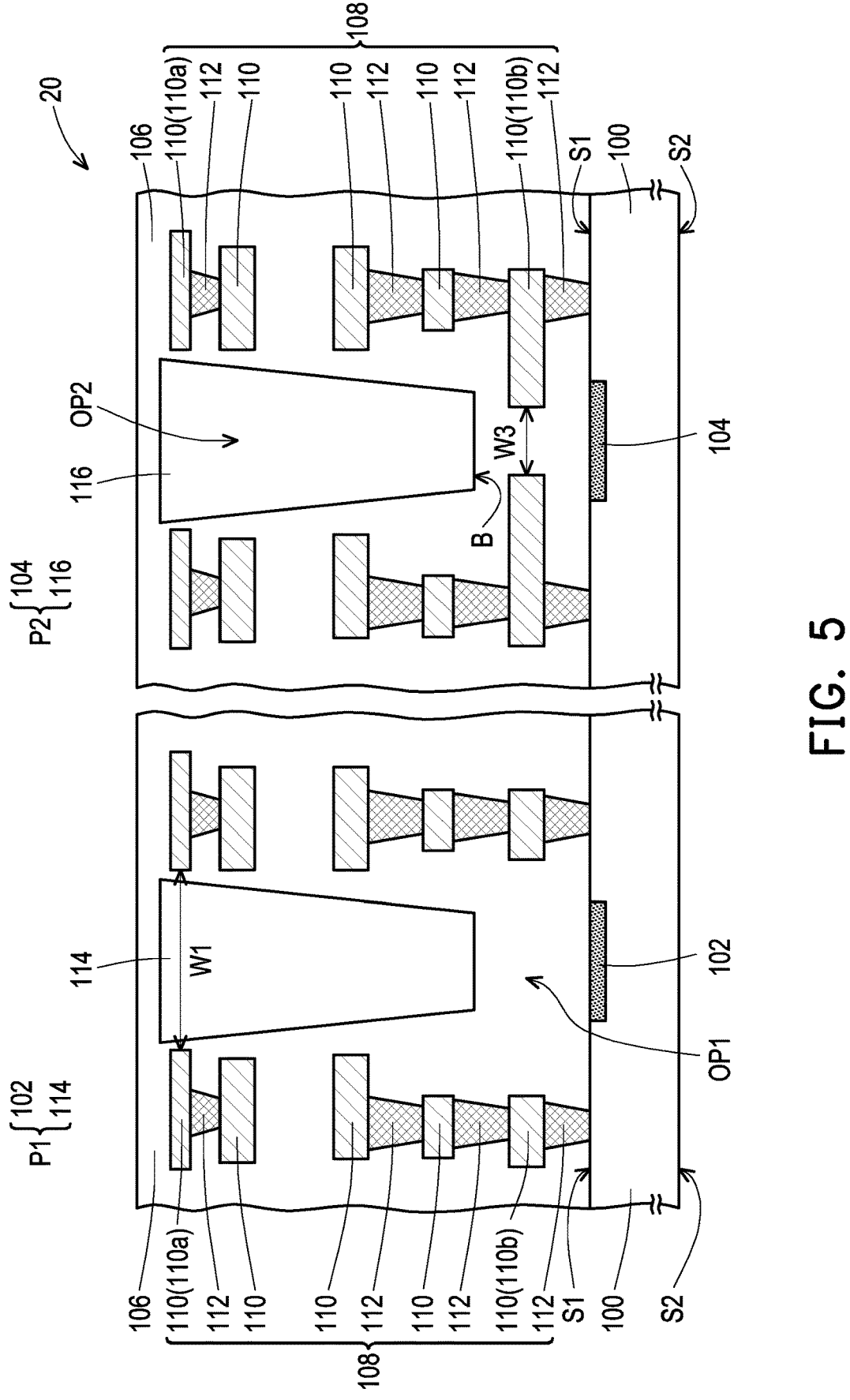
FIG. 5 is a cross-sectional view illustrating an image sensor structure according to other embodiments of the invention.
Figure 6:
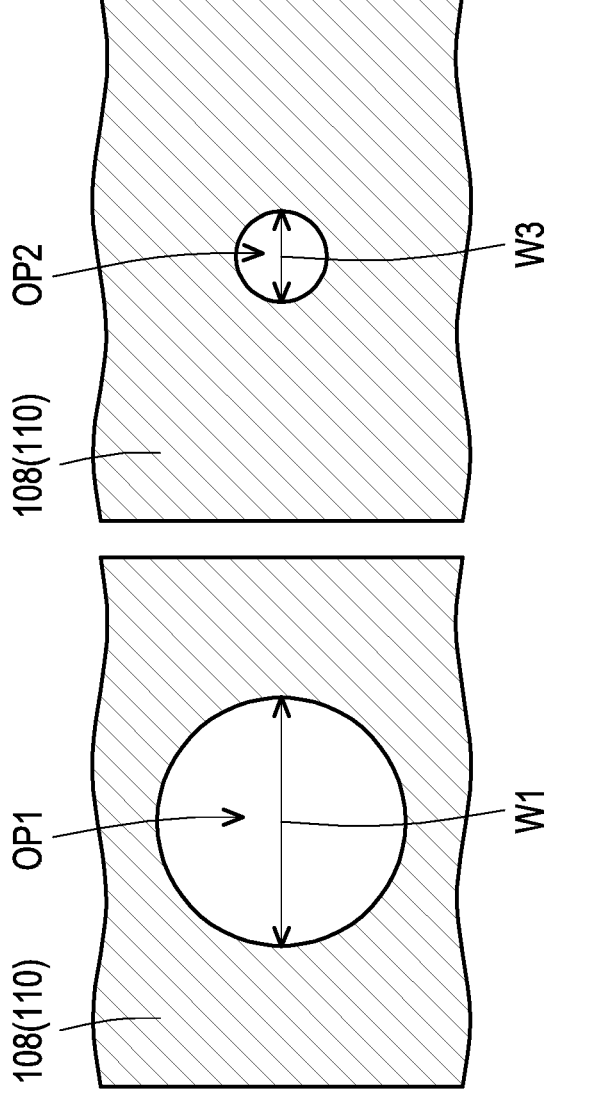
FIG. 6 is a top view of a conductive layer stack in FIG. 5.

FIG. 5 is a cross-sectional view illustrating an image sensor structure according to other embodiments of the invention. FIG. 6 is a top view of a conductive layer stack in FIG. 5.

Referring to FIG. 1, FIG. 5, and FIG. 6, the difference between an image sensor structure of FIG. 5 and the image sensor structure 10 of FIG. 1 is as follows. The number of layers in the conductive layer stack 108 in FIG. 5 may be greater than the number of layers in the conductive layer stack 108 in FIG. 1, but the invention is not limited thereto. One of ordinary skill in the art may adjust the number of layers in the conductive layer stack 108 in FIG. 5 according to the product requirement. In the image sensor structure 20, the pixel structure P1 may further include a light pipe structure 114. The light pipe structure 114 is disposed in the dielectric layer 106 inside the opening OP1. The light pipe structure 114 may be disposed directly above the light sensing device 102. In some embodiments, the material of the light pipe structure 114 may include a color filter material. In some embodiments, the refractive index of the material of the light pipe structure 114 may be greater than the refractive index of the material of the dielectric layer 106. In the image sensor structure 20, the pixel structure P2 may further include a light pipe structure 116. The light pipe structure 116 is disposed in the dielectric layer 106 inside the opening OP2. The light pipe structure 116 may be disposed directly above the light sensing device 104. In some embodiments, the material of the light pipe structure 116 may include a color filter material. In some embodiments, the refractive index of the material of the light pipe structure 116 may be greater than the refractive index of the material of the dielectric layer 106. In some embodiments, the material of the light pipe structure 114 and the material of the light pipe structure 116 may be the same material.

In the image sensor structure 20, the portion of the opening OP1 having the minimum width W1 may be located in any one of the conductive layers 110, and the portion of the opening OP2 having the minimum width W3 may be located in the conductive layer 110 lower than the bottom B of the light pipe structure 116. For example, as shown in FIG. 5, the portion of the opening OP1 having the minimum width W1 may be located in the topmost conductive layer (e.g., conductive layer 110a) of the conductive layers 110, and the portion of the opening OP2 having the minimum width W3 may be located in the bottommost conductive layer (e.g., conductive layer 110b) of the conductive layers 110, but the invention is not limited thereto. As long as the minimum width W3 of the opening OP2 may be smaller than the minimum width W1 of the opening OP1, it falls within the scope of the invention.

In the image sensor structure 20, the minimum width W3 of the opening OP2 may be smaller than the minimum width W1 of the opening OP1, so that the luminous flux of the pixel structure P2 may be smaller than the luminous flux of the pixel structure P1. In this way, the luminous flux of the pixel structure P2 is different from the luminous flux of the pixel structure P1.

In the image sensor structure 20, the difference between the luminous flux of the pixel structure P1 and the luminous flux of the pixel structure P2 may be 15% to 100% of the luminous flux of the pixel structure P1. In the image sensor structure 20, the difference between the luminous flux of the pixel structure P1 and the luminous flux of the pixel structure P2 may be 15% to 50% of the luminous flux of the pixel structure P1. In the image sensor structure 20, the difference between the luminous flux of the pixel structure P1 and the luminous flux of the pixel structure P2 may be 15% to 20% of the luminous flux of the pixel structure P1. In addition, the range of the above-mentioned difference helps to distinguish the pixel structure P1 from the pixel structure P2.

In addition, in the image sensor structure 20 of FIG. 5 and the image sensor structure 10 of FIG. 1, the same or similar components are denoted by the same reference symbols, and the description thereof is omitted. Furthermore, the image sensor structure 20 may include the pixel array PA1 as shown in FIG. 3 or FIG. 4, and the description thereof is omitted here. On the other hand, the pixel localization method of the image sensor structure 20 may refer to the pixel localization method of the image sensor structure 10, and the description thereof is not repeated here.

Based on the above embodiments, in the image sensor structure 20, the luminous flux of the pixel structure P2 is different from the luminous flux of the pixel structure P1. Therefore, the address of the pixel structure P1 to be analyzed can be located by using the pixel structure P2 as a reference point. In this way, the pixel structure P1 to be analyzed can be accurately located, which facilitates the subsequent analysis (e.g., physical failure analysis (PFA)) and improves the analysis process, thereby reducing the manufacturing cost and the process time.

Figure 7:
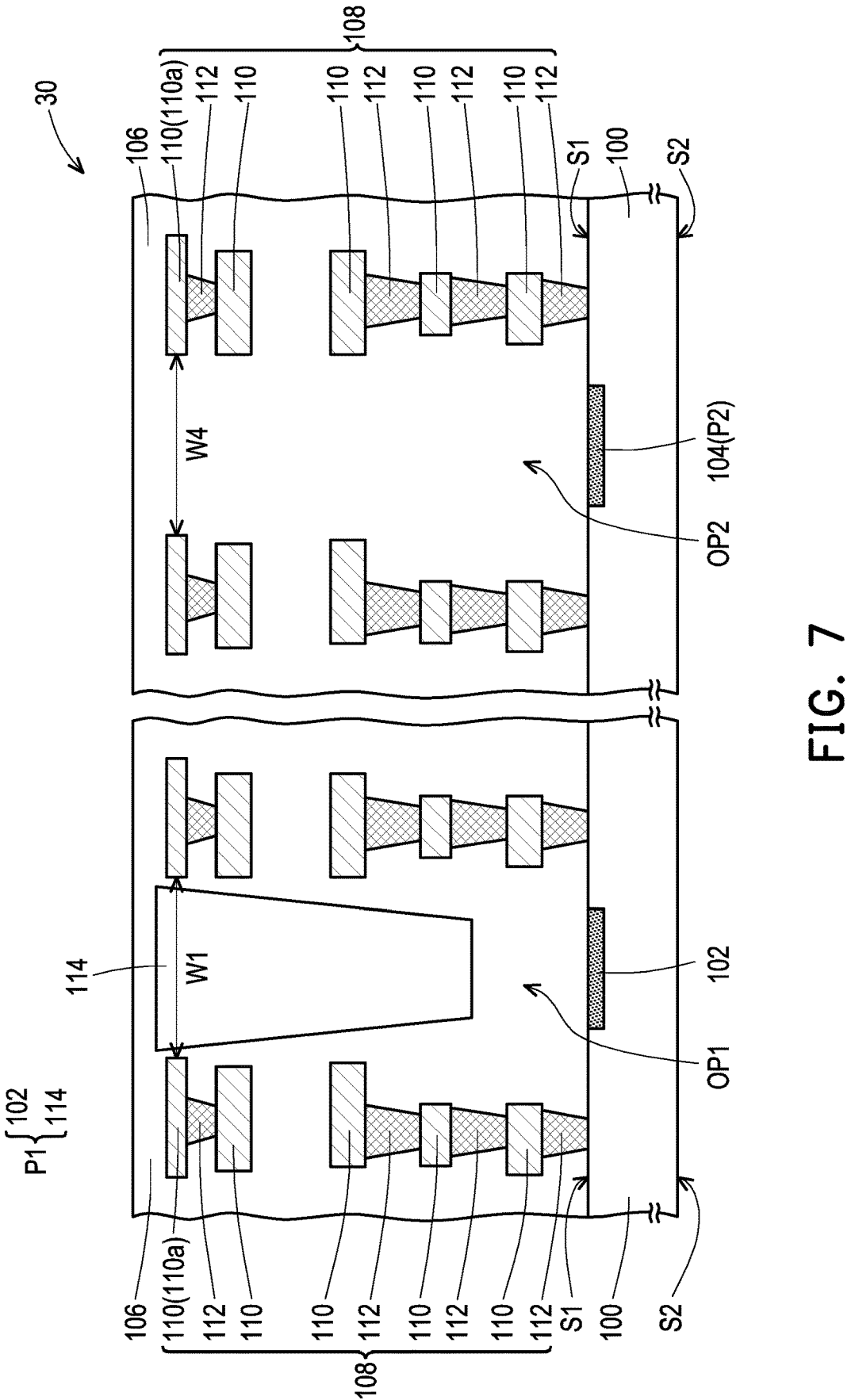
FIG. 7 is a cross-sectional view illustrating an image sensor structure according to other embodiments of the invention.
Figure 8:
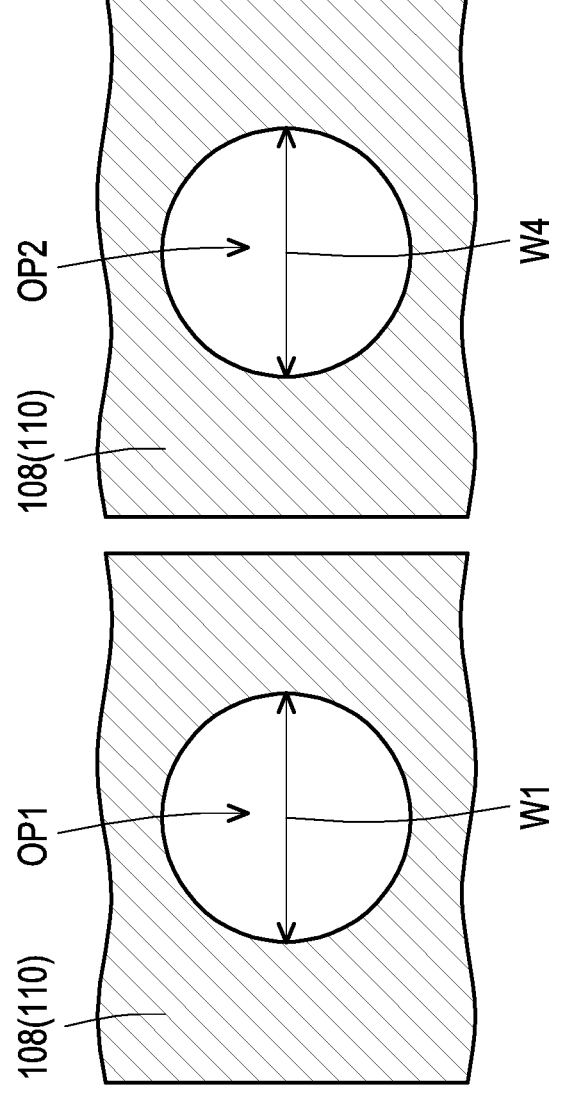
FIG. 8 is a top view of a conductive layer stack in FIG. 7.

FIG. 7 is a cross-sectional view illustrating an image sensor structure according to other embodiments of the invention. FIG. 8 is a top view of a conductive layer stack in FIG. 7.

Referring to FIG. 5, FIG. 7, and FIG. 8, the difference between an image sensor structure of FIG. 7 and the image sensor structure 20 of FIG. 5 is as follows. In the image sensor structure 30, there is no light pipe structure directly above the light sensing device 104. Furthermore, in the image sensor structure 30, the minimum width W4 of the opening OP2 may be equal to the minimum width W1 of the opening OP1. In the image sensor structure 30, the portion of the opening OP1 having the minimum width W1 may be located in any one of the conductive layers 110, and the portion of the opening OP2 having the minimum width W4 may be located in any one of the conductive layers 110. In the present embodiment, the portion of the opening OP1 having the minimum width W1 may be located in the topmost conductive layer (e.g., conductive layer 110a) of the conductive layers 110, and the portion of the opening OP2 having the minimum width W4 may be located in the topmost conductive layer (e.g., conductive layer 110a) of the conductive layers 110, but the invention is not limited thereto.

In the image sensor structure 30, since the light pipe structure 114 is disposed directly above the light sensing device 102, and there is no light pipe structure directly above the light sensing device 104, the luminous flux of the pixel structure P2 is different from the luminous flux of the pixel structure P1. For example, when the material of the light pipe structure 114 includes a color filter material, since the light pipe structure 114 filters out a portion of the incident light, the luminous flux of the pixel structure P1 may be smaller than the luminous flux of the pixel structure P2. In addition, when the refractive index of the material of the light pipe structure 114 is greater than the refractive index of the material of the dielectric layer 106, the incident light entering the light pipe structure 114 may generate total reflection at the interface between the light pipe structure 114 and the dielectric layer 106, so the light pipe structure 114 may have the effect of concentrating light, and the luminous flux of the pixel structure P1 may be greater than the luminous flux of the pixel structure P2.

In the image sensor structure 30, the difference between the luminous flux of the pixel structure P1 and the luminous flux of the pixel structure P2 may be 15% to 100% of the luminous flux of the pixel structure P1. In the image sensor structure 30, the difference between the luminous flux of the pixel structure P1 and the luminous flux of the pixel structure P2 may be 15% to 50% of the luminous flux of the pixel structure P1. In the image sensor structure 30, the difference between the luminous flux of the pixel structure P1 and the luminous flux of the pixel structure P2 may be 15% to 20% of the luminous flux of the pixel structure P1. In addition, the range of the above-mentioned difference helps to distinguish the pixel structure P1 from the pixel structure P2.

In addition, in the image sensor structure 30 of FIG. 7 and the image sensor structure 20 of FIG. 5, the same or similar components are denoted by the same reference symbols, and the description thereof is omitted. Furthermore, the image sensor structure 30 may include the pixel array PA1 as shown in FIG. 3 or FIG. 4, and the description thereof is omitted here. On the other hand, the pixel localization method of the image sensor structure 30 may refer to the pixel localization method of the image sensor structure 10, and the description thereof is not repeated here.

Based on the above embodiments, in the image sensor structure 30, the luminous flux of the pixel structure P2 is different from the luminous flux of the pixel structure P1. Therefore, the address of the pixel structure P1 to be analyzed can be located by using the pixel structure P2 as a reference point. In this way, the pixel structure P1 to be analyzed can be accurately located, which facilitates the subsequent analysis (e.g., physical failure analysis (PFA)) and improves the analysis process, thereby reducing the manufacturing cost and the process time.

Figure 9:
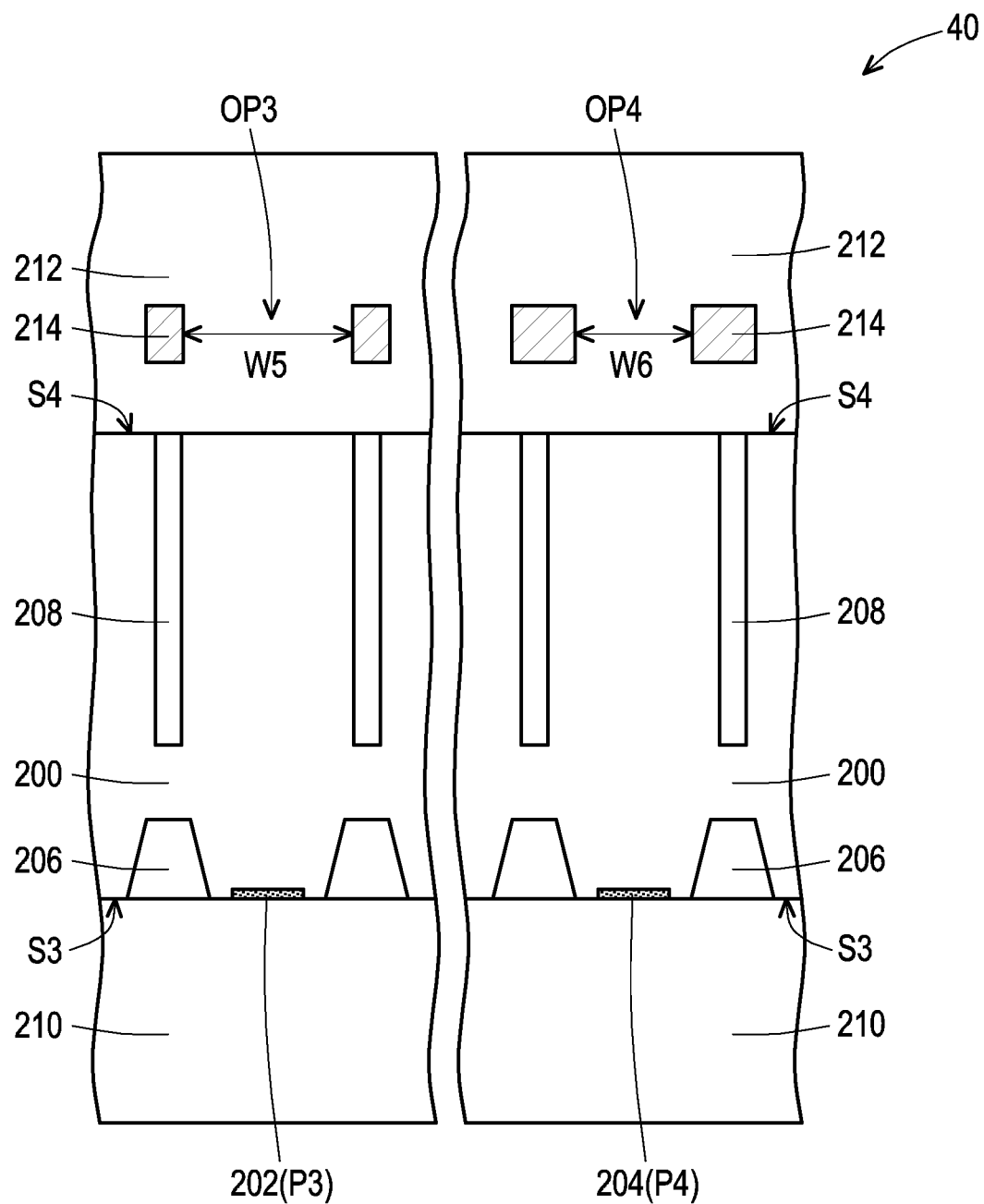
FIG. 9 is a cross-sectional view illustrating an image sensor structure according to other embodiments of the invention.
Figure 10:
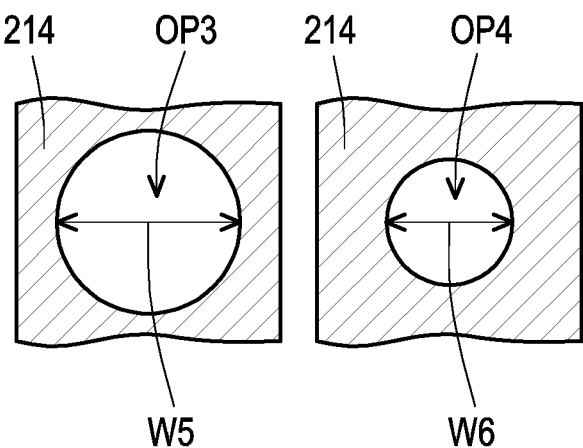
FIG. 10 is a top view of a light shielding layer in FIG. 9.
Figure 11:
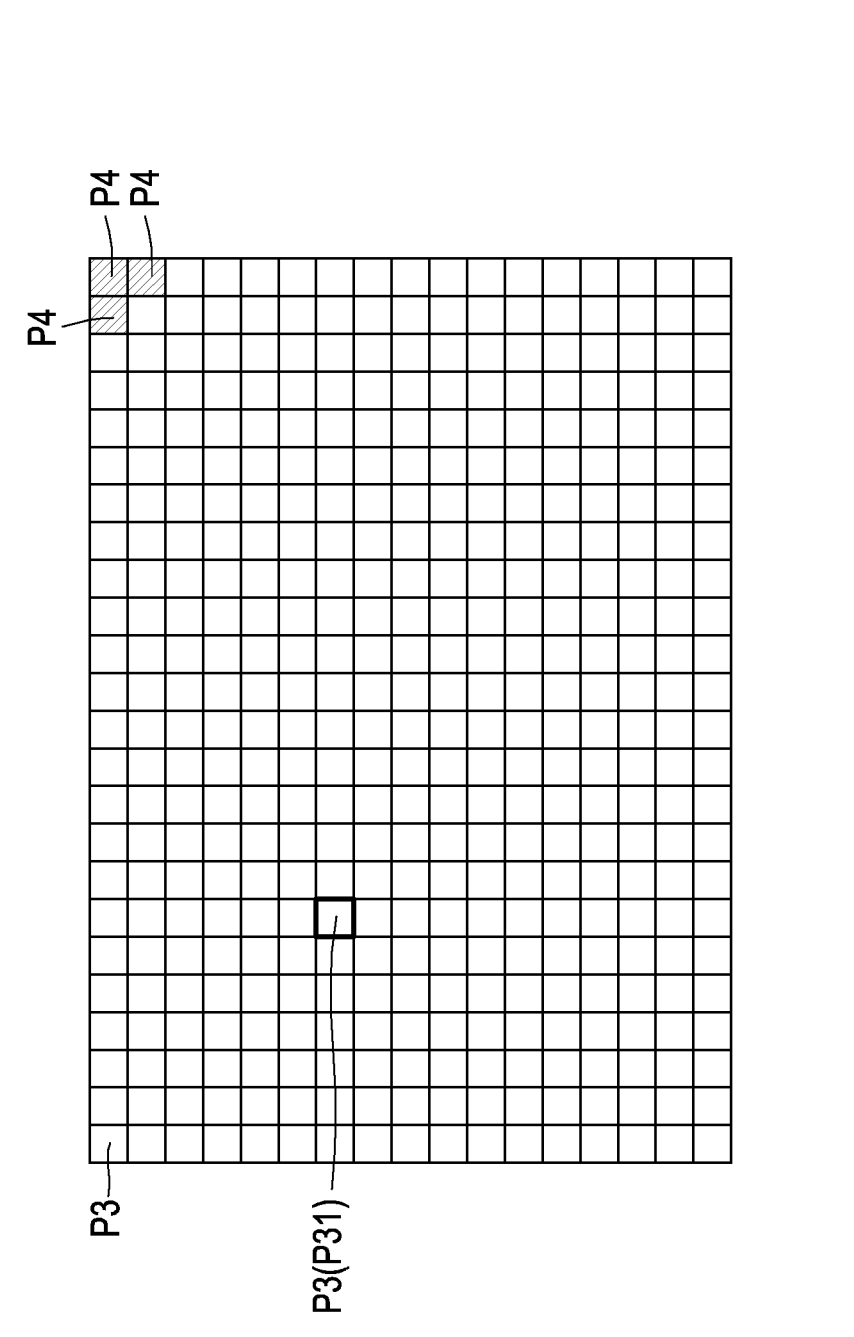
FIG. 11 is a top view illustrating a pixel array according to other embodiments of the invention.
Figure 12:
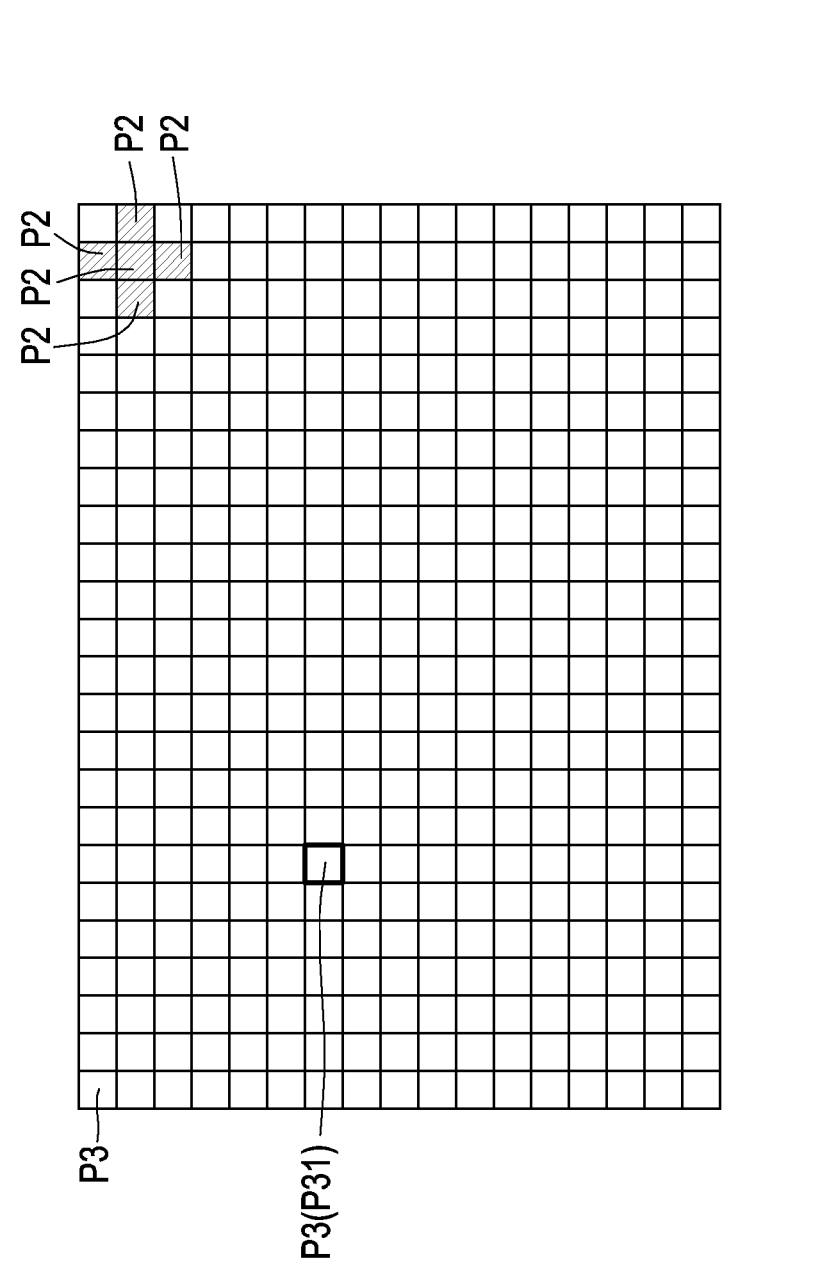
FIG. 12 is a top view illustrating a pixel array according to other embodiments of the invention.

FIG. 9 is a cross-sectional view illustrating an image sensor structure according to other embodiments of the invention. FIG. 10 is a top view of a light shielding layer in FIG. 9. FIG. 11 is a top view illustrating a pixel array according to other embodiments of the invention. FIG. 12 is a top view illustrating a pixel array according to other embodiments of the invention.

Referring to FIG. 9, an image sensor structure 40 includes a substrate 200, a pixel structure P3 and a pixel structure P4. In the present embodiment, the image sensor structure 40 may be a backside illuminated (BSI) image sensor structure. The substrate 200 may have a first side S3 and a second side S4 opposite to each other. In some embodiments, the first side S3 may be the front side of the substrate 200, and the second side S4 may be the back side of the substrate 200. In some embodiments, the substrate 200 may be a semiconductor substrate such as a silicon substrate. In addition, although not shown in FIG. 9, the substrate 200 may have required components therein and/or thereon, such as transistor devices, and the description thereof is omitted here.

The pixel structure P3 includes a light sensing device 202. The light sensing device 202 is disposed in the substrate 200. The light sensing device 202 may be adjacent to the first side S3 of the substrate 200. In some embodiments, the light sensing device 202 may be a photodiode.

The pixel structure P4 includes a light sensing device 204. The light sensing device 204 is disposed in the substrate 200. The light sensing device 204 may be adjacent to the first side S3 of the substrate 200. In some embodiments, the light sensing device 204 may be a photodiode.

The image sensor structure 40 may further include an isolation structure 206 and an isolation structure 208. The isolation structure 206 is disposed in the substrate 200. The isolation structure 206 may extend into the substrate 200 from the first side S3 of the substrate 200. In some embodiments, the material of the isolation structure 206 is, for example, a dielectric material such as silicon oxide. The isolation structure 208 is disposed in the substrate 200. The isolation structure 208 may extend into the substrate 200 from the second side S4 of the substrate 200. In some embodiments, the material of the isolation structure 208 is, for example, a dielectric material such as silicon oxide.

The image sensor structure 40 may further include a dielectric layer 210. The dielectric layer 210 is disposed on the first side S3 of the substrate 200. In some embodiments, the dielectric layer 210 may be a multilayer structure. In some embodiments, the material of the dielectric layer 210 is, for example, silicon oxide, silicon nitride, silicon oxynitride, or a combination thereof. In addition, although not shown in FIG. 9, the dielectric layer 210 may have required components therein, such as an interconnect structure, and the description thereof is omitted here.

The image sensor structure 40 may further include a dielectric layer 212 and a light shielding layer 214. The dielectric layer 212 is disposed on the second side S4 of the substrate 200. In some embodiments, the dielectric layer 212 may be a multilayer structure. In some embodiments, the material of the dielectric layer 212 is, for example, silicon oxide, silicon nitride, silicon oxynitride, or a combination thereof.

The light shielding layer 214 is disposed in the dielectric layer 212. In some embodiments, the light shielding layer 214 may be a metal grid, which corresponds to and defines each pixel structure. The light shielding layer 214 may have a single-layer structure or a multilayer structure. In some embodiments, the material of the light shielding layer 214 is, for example, copper, aluminum, tungsten, tantalum, tantalum nitride, titanium, titanium nitride, or a combination thereof. In addition, the number of the light shielding layers 214 is not limited to the number shown in FIG. 9. One of ordinary skill in the art may adjust the number of the light shielding layers 214 according to the product requirement. In some embodiments, the image sensor structure 40 may further include components such as the color filter and the microlens (not shown) sequentially disposed on the dielectric layer 212 and the light shielding layer 214, and the description thereof is omitted here.

Referring to FIG. 9 and FIG. 10, the light shielding layer 214 may have an opening OP3 and an opening OP4. The opening OP3 may be located directly above the light sensing device 202 and may passes through the light shielding layer 214. The opening OP3 may have a minimum width W5. The opening OP4 may be located directly above the light sensing device 204 and may passes through the light shielding layer 214. The opening OP4 may have a minimum width W6. The dielectric layer 212 may fill the opening OP3 and the opening OP4.

The minimum width W6 of the opening OP4 may be smaller than the minimum width W5 of the opening OP3, so that the luminous flux of the pixel structure P4 may be smaller than the luminous flux of the pixel structure P3. In this way, the luminous flux of the pixel structure P4 is different from the luminous flux of the pixel structure P3.

In some embodiments, the difference between the luminous flux of the pixel structure P3 and the luminous flux of the pixel structure P4 may be 15% to 100% of the luminous flux of the pixel structure P3. In some embodiments, the difference between the luminous flux of the pixel structure P3 and the luminous flux of the pixel structure P4 may be 15% to 50% of the luminous flux of the pixel structure P3. In some embodiments, the difference between the luminous flux of the pixel structure P3 and the luminous flux of the pixel structure P4 may be 15% to 20% of the luminous flux of the pixel structure P3. In addition, the range of the above-mentioned difference helps to distinguish the pixel structure P3 from the pixel structure P4.

Referring to FIG. 11, the image sensor structure 40 may include a pixel array PA2. The pixel array PA2 may include the pixel structures P3 and the pixel structure P4. In the present embodiment, the pixel array PA2 may include the pixel structures P4, but the invention is not limited thereto. As long as the pixel array PA2 includes at least one pixel structure P4, it falls within the scope of the invention. The pixel structures P4 may be adjacent to each other. In some embodiments, the pixel structure P4 may be adjacent to the edge of the pixel array PA2, thereby preventing the yield and the image presentation from being affected. For example, the pixel structure P4 may be adjacent to the corner of the pixel array PA2.

In some embodiments, the top-view patterns of the pixel structures P4 may be arranged in a special shape to facilitate the identification of the positions of the pixel structures P4. In the present embodiment, the top-view patterns of the pixel structures P4 may be arranged in an L-shape, but the invention is not limited thereto. One of ordinary skill in the art may adjust the shape in which the top-view patterns of the pixel structures P4 are arranged according to the product requirement. In other embodiments, as shown in FIG. 12, the top-view patterns of the pixel structures P4 may be arranged in a cross shape.

In some embodiments, the pixel localization method of the image sensor structure 40 may include the following steps. First, the image sensor structure 40 is provided. Next, the pixel structure P3 (e.g., pixel structure P31) to be analyzed is selected from the pixel structures P3. Then, the address of the pixel structure P3 (e.g., pixel structure P31) to be analyzed is located by using the pixel structure P4 as a reference point.

Based on the above embodiments, in the image sensor structure 40, the luminous flux of the pixel structure P4 is different from the luminous flux of the pixel structure P3. Therefore, the address of the pixel structure P3 to be analyzed can be located by using the pixel structure P4 as a reference point. In this way, the pixel structure P3 to be analyzed can be accurately located, which facilitates the subsequent analysis (e.g., physical failure analysis (PFA)) and improves the analysis process, thereby reducing the manufacturing cost and the process time.

In summary, in the image sensor structure of the afore-mentioned embodiments, the image sensor structure includes a first pixel structure and a second pixel structure, and the luminous flux of the second pixel structure is different from the luminous flux of the first pixel structure. Therefore, the address of the first pixel structure to be analyzed can be accurately located by using the second pixel structure as a reference point, thereby improving the analysis process and reducing the manufacturing cost and the process time.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An image sensor structure, comprising:
a substrate;
first pixel structures, wherein each of the first pixel structures comprises a first light sensing device, and the first light sensing device is disposed in the substrate;

second pixel structures, wherein each of the second pixel structures comprises a second light sensing device, and the second light sensing device is disposed in the substrate;
a dielectric layer disposed on the substrate; and
a conductive layer stack comprising conductive layers and having a first opening and a second opening, wherein
the conductive layers are disposed in the dielectric layer,
the first opening is located directly above the first light sensing device and passes through the conductive layers,
the first opening has a first minimum width,
the second opening is located directly above the second light sensing device and passes through the conductive layers,
the second opening has a second minimum width,
the second minimum width of the second opening is smaller than the first minimum width of the first opening,
a luminous flux of each of the second pixel structures is different from a luminous flux of each of the first pixel structures,
the first pixel structures and the second pixel structures constitute a pixel array, the second pixel structures arranging in a cross shape or an L-shape are disposed adjacent to a corner of the pixel array, and one of the first pixel structures is addressed by using the second pixel structures as a reference point.

2. The image sensor structure according to claim 1, wherein a difference between the luminous flux of each of the first pixel structures and the luminous flux of each of the second pixel structures is 15% to 100% of the luminous flux of each of the first pixel structures.

3. The image sensor structure according to claim 1, wherein a difference between the luminous flux of each of the first pixel structures and the luminous flux of each of the second pixel structures is 15% to 50% of the luminous flux of each of the first pixel structures.

4. The image sensor structure according to claim 1, wherein a difference between the luminous flux of each of the first pixel structures and the luminous flux of each of the second pixel structures is 15% to 20% of the luminous flux of each of the first pixel structures.

5. The image sensor structure according to claim 1, wherein the first light sensing device and the second light sensing device comprise photodiodes.

6. The image sensor structure according to claim 1, wherein the image sensor structure comprises a front side illuminated image sensor structure.

7. The image sensor structure according to claim 1, wherein
a portion of the first opening having the first minimum width is located in any one of the conductive layers, and
a portion of the second opening having the second minimum width is located in any one of the conductive layers.

8. The image sensor structure according to claim 1, wherein the dielectric layer fills the first opening and the second opening,
each of the first pixel structures further comprises a first light pipe structure, wherein the first light pipe structure is disposed in the dielectric layer inside the first opening, and each of the second pixel structures further comprises a second light pipe structure, wherein the second light pipe structure is disposed in the dielectric layer inside the second opening.

9. The image sensor structure according to claim 8, wherein a portion of the first opening having the first minimum width is located in any one of the conductive layers, and a portion of the second opening having the second minimum width is located in the conductive layer lower than a bottom of the second light pipe structure.

10. An image sensor structure, comprising:

a substrate;

first pixel structures, wherein each of the first pixel structures comprises a first light sensing device and a light pipe structure, the first light sensing device is disposed in the substrate, and the light pipe structure is disposed directly above the first light sensing device; and second pixel structures, wherein each of the second pixel structures comprises a second light sensing device, the second light sensing device is disposed in the substrate, there is no light pipe structure directly above the second light sensing device, a luminous flux of each of the second pixel structures is different from a luminous flux of each of the first pixel structures, the first pixel structures and the second pixel structures constitute a pixel array, the second pixel structures arranging in a cross shape or an L-shape are disposed adjacent to a corner of the pixel array, and one of the first pixel structures is addressed by using the second pixel structures as a reference point.

11. The image sensor structure according to claim 10, wherein a material of the light pipe structure comprises a color filter material.

12. The image sensor structure according to claim 10, wherein a refractive index of a material of the light pipe structure is greater than a refractive index of a material of the dielectric layer.

13. The image sensor structure according to claim 10, wherein the image sensor structure comprises a front side illuminated image sensor structure.

14. An image sensor structure, comprising:

a substrate comprising a first side and a second side opposite to each other, first pixel structures, wherein each of the first pixel structures comprises a first light sensing device, and the first light sensing device is disposed in the substrate and is adjacent to the first side of the substrate;

second pixel structures, wherein each of the second pixel structures comprises a second light sensing device, and the second light sensing device is disposed in the substrate and is adjacent to the first side of the substrate;

a dielectric layer disposed on the second side of the substrate; and a light shielding layer disposed in the dielectric layer and having a first opening and a second opening, wherein the first opening is located directly above the first light sensing device and passes through the light shielding layer, the first opening has a first minimum width, the second opening is located directly above the second light sensing device and passes through the light shielding layer, the second opening has a second minimum width, the second minimum width of the second opening is smaller than the first minimum width of the first opening, a luminous flux of each of the second pixel structures is different from a luminous flux of each of the first pixel structures, the first pixel structures and the second pixel structures constitute a pixel array, the second pixel structures arranging in a cross shape or an L-shape are disposed adjacent to a corner of the pixel array, and one of the first pixel structures is addressed by using the second pixel structures as a reference point.

15. The image sensor structure according to claim 14, wherein the image sensor structure comprises a backside illuminated image sensor structure.

\* \* \* \* \*